(12) United States Patent
Sforzin et al.

(10) Patent No.: US 7,359,246 B2
(45) Date of Patent: Apr. 15, 2008

(54) MEMORY DEVICE WITH A RAMP-LIKE VOLTAGE BIASING STRUCTURE BASED ON A CURRENT GENERATOR

(75) Inventors: Marco Sforzin, Cantu' (IT); Nicola Del Gatto, Torre Del Greco (IT); Marco Ferrario, Milan (IT); Emanuele Confalonieri, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 239 days.

(21) Appl. No.: 11/340,414

(22) Filed: Jan. 26, 2006

(65) Prior Publication Data

US 2006/0198187 A1   Sep. 7, 2006

(30) Foreign Application Priority Data

Jan. 28, 2005   (EP) .................................. 05100551

(51) Int. Cl.
| | |
|---|---|
| G11C 11/34 | (2006.01) |
| G11C 16/04 | (2006.01) |
| G11C 11/4063 | (2006.01) |
| G11C 11/4091 | (2006.01) |
| G11C 11/24 | (2006.01) |
| G11C 7/06 | (2006.01) |

(52) U.S. Cl. ............................. 365/185.19; 365/185.2; 365/185.03; 365/150; 365/208; 365/189.05

(58) Field of Classification Search ..................... None
See application file for complete search history.

(56) References Cited

U.S. PATENT DOCUMENTS

| | | | | |
|---|---|---|---|---|
| 5,687,115 A | | 11/1997 | Wong et al. ............ | 365/185.03 |
| 5,748,533 A | * | 5/1998 | Dunlap et al. ......... | 365/185.19 |
| 5,933,366 A | * | 8/1999 | Yoshikawa ............. | 365/185.03 |
| 6,195,289 B1 | * | 2/2001 | Pasotti et al. .......... | 365/185.21 |
| 6,275,417 B1 | * | 8/2001 | Lee et al. ............... | 365/185.19 |
| 6,621,737 B2 | * | 9/2003 | Naura et al. ........... | 365/185.18 |
| 7,054,197 B2 | * | 5/2006 | Vimercati .............. | 365/185.18 |
| 7,075,844 B2 | * | 7/2006 | Pagliato et al. ............. | 365/207 |
| 2006/0209594 A1 | * | 9/2006 | Pio et al. ................ | 365/185.03 |
| 2006/0215463 A1 | * | 9/2006 | Vimercati et al. ...... | 365/189.07 |

FOREIGN PATENT DOCUMENTS

| | | |
|---|---|---|
| EP | 0 798 739 A2 | 10/1997 |
| EP | 1 467 377 A1 | 10/2004 |

\* cited by examiner

*Primary Examiner*—Huan Hoang
*Assistant Examiner*—Michael Weinberg
(74) *Attorney, Agent, or Firm*—Lisa K. Jorgenson; E. Russell Tarleton; Seed IP Law Group PLLC

(57) ABSTRACT

A memory device includes a plurality of memory cells each one for storing a value, at least one reference cell, biasing means for biasing a set of selected memory cells and the at least one reference cell with a biasing voltage having a substantially monotone time pattern, means for detecting the reaching of a threshold value by a current of each selected memory cell and of each reference cell, and means for determining the value stored in each selected memory cell according to a temporal relation of the reaching of the threshold value by the currents of the selected memory cell and of the at least one reference cell. The biasing means includes means for applying a controlled biasing current to the selected memory cells and to the at least one reference cell.

24 Claims, 5 Drawing Sheets

MEMORY DEVICE WITH A RAMP-LIKE VOLTAGE BIASING STRUCTURE BASED ON A CURRENT GENERATOR

BACKGROUND OF THE INVENTION

1. Field of the Invention

The present invention relates to the memory field. More specifically, the present invention relates to the reading of memory devices.

2. Description of the Related Art

Memory devices are commonly used to store information (either temporarily or permanently) in a number of applications; for example, in a non-volatile memory device the information is preserved even if a power supply is off. Typically, the memory device includes a matrix of memory cells (for example, consisting of floating gate MOS transistors); each memory cell has a threshold voltage that can be programmed to different levels representing corresponding logical values. Particularly, in a multi-level memory device each cell can take more than two levels (and then store a plurality of bits).

The logical values stored in selected cells of the memory device are read by comparing a current flowing through each memory cell with the ones provided by one or more reference cells (in a known condition). For this purpose, a suitable biasing voltage is applied to the selected memory cells and to the reference cells. However, the correctness of the reading operation strongly depends on the accuracy and the repeatability of the biasing voltage. This problem is particular acute in multi-level memory devices, wherein the safety margin for discriminating the different logical values is narrower.

A different technique is disclosed in U.S. Patent Application Publication No. 2004/0257876 (the entire disclosure of which is herein incorporated by reference). This document proposes the use of a biasing voltage having a monotone time pattern; preferably, the waveform of the biasing voltage consists of a ramp, which increases linearly over time with a constant slope. In this case, each selected memory cell and the reference cells turn on at different times (as soon as the biasing voltage reaches their threshold voltages). The temporal order of the tuning on of the memory cell with respect to the ones of the reference cells uniquely identifies the logical value stored therein. In this way, the precision of the reading operation is strongly improved and made independent of most external factors (such as the temperature).

However, the above-described technique requires that the biasing voltage should exhibit the desired time-pattern with a high accuracy; particularly, the biasing voltage should preferably change as much as possible linearly over time. Moreover, the biasing voltage that is applied to the selected memory cells and to the reference cells must have the same value, or at least the same slope.

For this purpose, the memory device is generally provided with a ramp generator receiving a model voltage (having the desired ramp-like pattern), which is created separately from a power supply voltage of the memory device; this model voltage is then applied to the selected memory cells and to the reference cells by means of a voltage follower. The biasing voltage is feedback-regulated according to the voltage that is actually measured at the reference cells.

A drawback of the solution known in that art is the high complexity of the ramp generator. Particularly, the above-described closed-loop involves a waste of area in a chip of semiconductor material wherein the memory device is typically integrated. In any case, operation of the ramp generator is slow; as a result, the slope of the biasing voltage must be quite low, thereby increasing the reading time of the memory device.

BRIEF SUMMARY OF THE INVENTION

According to one embodiment of the present invention, the generation of the biasing voltage from a current is suggested.

Particularly, one embodiment of the present invention proposes a memory device. The memory device includes a plurality of memory cells (each one for storing a value) and one or more reference cells. Biasing means is used for biasing a set of selected memory cells and the reference cells with a biasing voltage, which has a substantially monotone time pattern. The memory device further includes means for detecting the reaching of a threshold value by a current of each selected memory cell and of each reference cell. Means is provided for determining the value stored in each selected memory cell according to a temporal relation of the reaching of the threshold value by the currents of the selected memory cell and of the at least one reference cell. The biasing means includes means for applying a predetermined biasing current to the selected memory cells and to the at least one reference cell.

The proposed solution implements an open-loop design having a very simple structure.

Therefore, this strongly reduces the waste of area in the chip of semiconductor material.

Moreover, operation of the proposed structure is very fast. As a result, it is possible to have a high slope of the biasing voltage. This reduces the reading time, with a beneficial effect on the performance of the whole memory device.

The different embodiments of the invention described in the following provide additional advantages.

For example, the biasing current is a constant current.

This provides a biasing voltage including a ramp-like portion with a constant slope.

In a preferred implementation of the invention the biasing current is applied to a common node, from which a first path (including the selected memory cells) and a second path (including the reference cells) branch.

The proposed structure allows achieving the desired result with a very simple structure.

As a further enhancement, means is provided for equalizing an equivalent resistance of the two paths.

This feature reduces any difference between the biasing voltages at the selected memory cells and at the reference cells.

In addition or in alternative, means is provided for equalizing an equivalent capacitance of the two paths.

As a result, any mismatch between the biasing voltages at the selected memory cells and at the reference cells is substantially avoided.

In a preferred embodiment of the invention, the memory device includes means for trimming the biasing current.

This allows obtaining the desired slope of the biasing voltage in any operative condition.

A suggested choice for the above-mentioned feature is that of having multiple trimming elements that provide corresponding correction currents (of the biasing current) with two or more different absolute values.

The proposed solution allows either a fine regulation of the slope (for the actual operation of the memory device) or a rough regulation thereof (for test purposes).

Without detracting from its general applicability, the solution of the invention has been specifically designed for a non-volatile memory device.

Moreover, the advantages of the proposed structure are more apparent in a memory device of the multi-level type.

Another embodiment of the present invention provides a corresponding method for reading a memory device.

BRIEF DESCRIPTION OF THE SEVERAL VIEWS OF THE DRAWINGS

The invention itself, as well as further features and advantages thereof, will be best understood by reference to the following detailed description, given purely by way of a non-restrictive indication, to be read in conjunction with the accompanying drawings, in which.

DETAILED DESCRIPTION OF THE INVENTION

Figure 1:
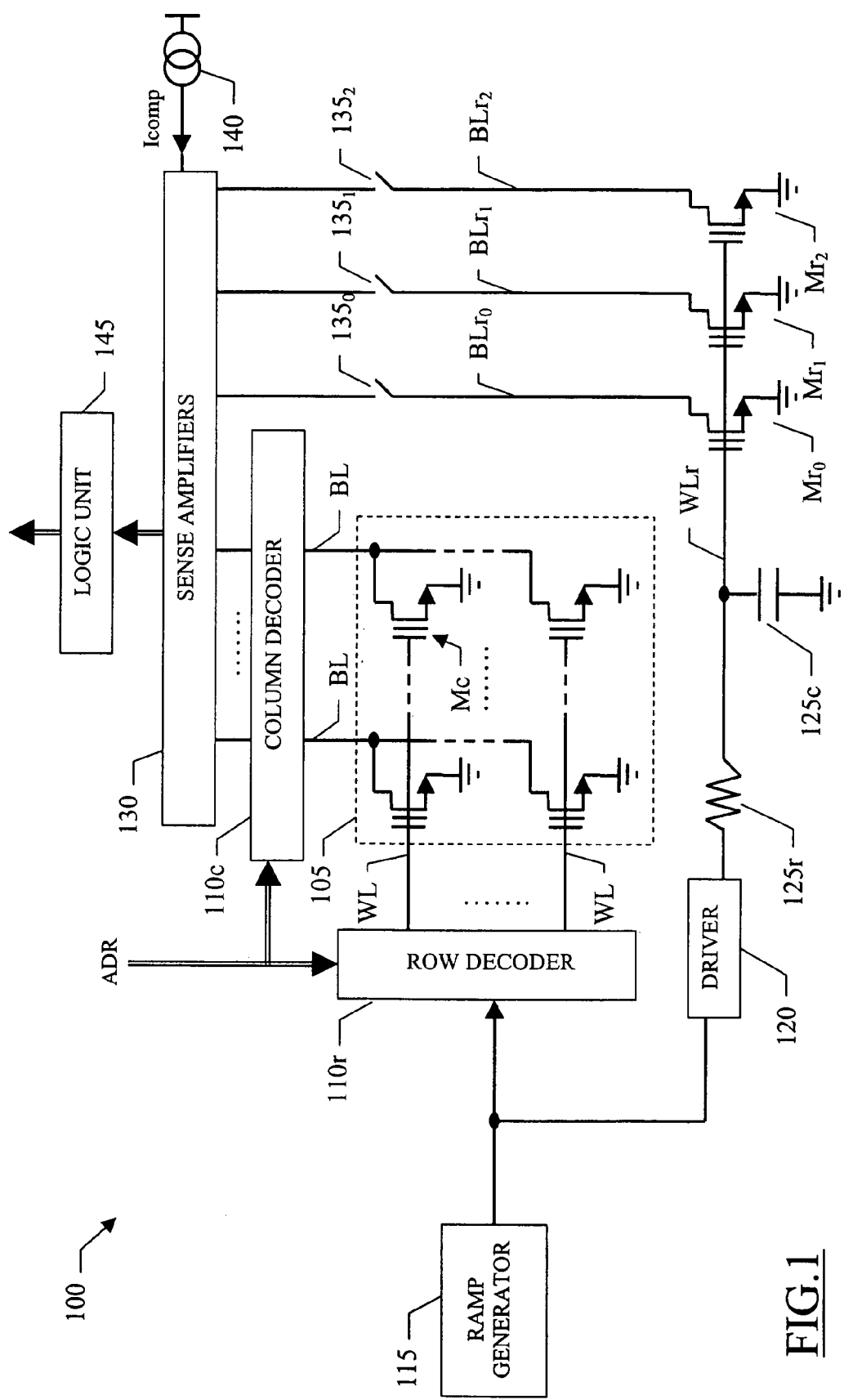
FIG. 1 is a schematic block diagram of a memory device in which the solution according to an embodiment of the invention can be used.

With reference in particular to FIG. 1, a non-volatile memory device 100 (for example, a flash E$^2$PROM) is illustrated. The memory device 100 is integrated on a chip of semiconductor material, and includes a matrix 105 of memory cells Mc (for example, with 512 rows and 1024 columns). Each memory cell Mc includes a floating gate MOS transistor with a programmable threshold voltage Vthc. The memory cell Mc in a non-programmed (or erased) condition exhibits a low threshold voltage. The memory cell Mc is programmed by injecting electric charge into its floating gate; the memory cell Mc can be programmed at multiple levels, each one associated with a corresponding range of the threshold voltage Vthc. Each level represents a different logical value; for example, the memory device 100 operates at 4 levels, so that each memory cell Mc stores a logical value consisting of 2 bits of information (11, 10, 01 and 00 for increasing threshold voltages Vthc). The matrix 105 includes one or more sectors (only one shown in the figure), which can be erased individually. Each sector is associated with three reference cells $Mr_0$, $Mr_1$, and $Mr_2$ that are used for discriminating the logical values stored in the memory cells Mc. For this purpose, the threshold voltages of the reference cells $Mr_0$, $Mr_1$, and $Mr_2$ (denoted with $Vthr_0$, $Vthr_1$ and $Vthr_2$) are set to predefined values between the levels of the logical values 11-10, 10-01 and 01-00, respectively.

In the example at issue, the matrix 105 has a so-called NOR architecture. Particularly, the drain terminals of the memory cells Mc of each column are connected to a corresponding bit line BL, whereas the control gate terminals of the memory cells Mc of each row are connected to a corresponding word line WL; the source terminals of all the memory cells Mc are connected to a common terminal providing a reference voltage (or ground). The memory device 100 simultaneously processes a word (for example, consisting of 16 bits). The bits of each word are stored in a page of memory cells Mc (16/2=8 in the example at issue), which are associated with a single word line WL; the bit lines BL of the matrix 105 are grouped into 8 sub-sets, each one for the memory cells Mc (placed on the same column) of the different pages. Likewise, the drain terminals of the reference cells $Mr_0$, $Mr_1$, and $Mr_2$ are connected to a bit line $BLr_0$, $BLr_1$ and $BLr_2$, respectively. The control gate terminals of all the reference cells $Mr_0$, $Mr_1$, and $Mr_2$ are connected to a common word line WLr, whereas their source terminals are connected to the ground terminal.

The memory device 100 receives an address ADR for accessing a corresponding page. A portion of the address ADR is supplied to a row decoder 110r, which selects the desired word line WL. Another portion of the address ADR is supplied to a column decoder 110c, which selects the desired bit line BL in each sub-set.

The row decoder 110r couples the selected word line WL with a ramp generator 115. The ramp generator 115 is further coupled with the world line WLr through a driver 120 and a dummy resistor 125r (connected in series); a dummy capacitor 125c is also connected in parallel to the reference cells $Mr_0$, $Mr_1$, and $Mr_2$ (between the word line WLr and the ground terminal). As will be apparent in the following, the dummy resistor 125r and the dummy capacitor 125c are used to change an equivalent resistance and an equivalent capacitance, respectively, that is seen by the ramp generator 115. The ramp generator 115 applies a biasing voltage to the control gate terminals of the selected memory cells Mc and of the reference cells $Mr_0$, $Mr_1$, and $Mr_2$; the biasing voltage has a ramp-like pattern, with its value that increases linearly over time according to a constant slope.

The column decoder 110c connects the selected bit lines BL to a bank of sense amplifiers 130. The sense amplifiers 130 are also connected to the bit lines $BLr_0$, $BLr_1$ and $BLr_2$ through a switch $135_0$, $135_1$, and $135_2$, respectively. Moreover, the sense amplifiers 130 receive a comparison current Icomp; the comparison current Icomp is provided by a current generator 140, and has a value lower than the current flowing through every (memory or reference) cell Mc,$Mr_0$-$Mr_2$ when conductive. As described in detail in the following, the sense amplifiers 130 compare the currents flowing through the selected memory cells Mc and the reference cells $Mr_0$-$Mr_2$ with the current Icomp, so as to detect their turning on. This information is supplied to a logic unit 145, which determines the logical value stored in each selected memory cell Mc according to the temporal relation of the relevant turning on times.

Figure 2A:
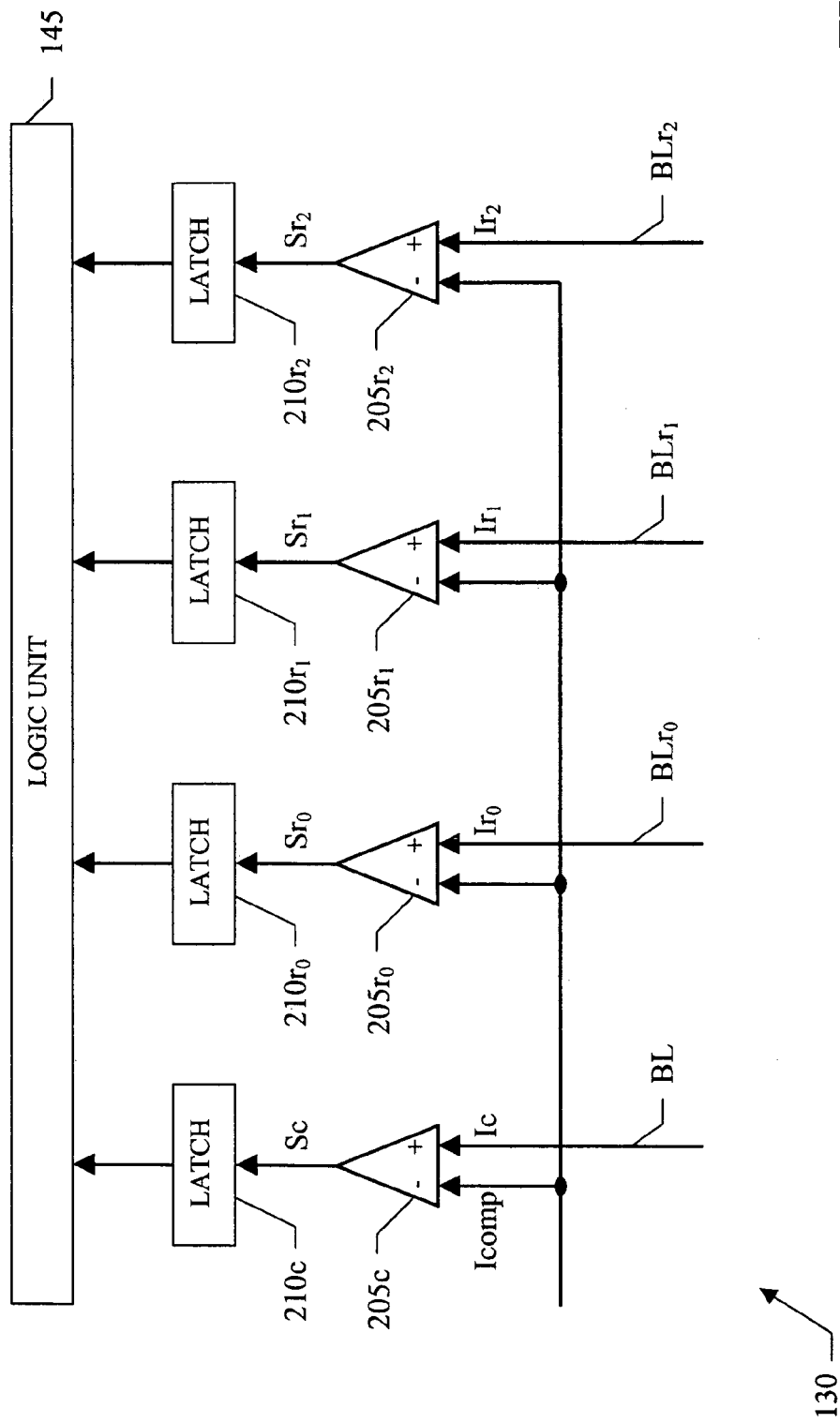
FIG. 2a details an exemplary implementation of a sense amplifier of the memory device.

Considering now FIG. 2a, the sense amplifiers 130 include four comparators 205c, $205r_0$, $205r_1$ and $205r_2$ for each selected bit line BL. Particularly, the non-inverting input terminal of the comparator 205c receives a cell current Ic flowing through the selected bit line BL (and then through the desired memory cell to be read); on the other hand, the non-inverting input terminals of the comparators $205r_0$, $205r_1$ and $205r_2$ receive a reference current $Ir_0$, $Ir_1$ and $Ir_2$ flowing through the bit lines $BLr_0$, $BLr_1$ and $BLr_2$, respectively (and then through the corresponding reference cells). The inverting input terminals of all the comparators 205c, $205r_0$-$205r_2$ instead receive the comparison current Icomp.

The comparators 205c, $205r_0$, $205r_1$ and $205r_2$ output a conduction bit Sc, $Sr_0$, $Sr_1$ and $Sr_2$, respectively, which is asserted (for example, at the logical value 1) when the corresponding current Ic, $Ir_0$, $Ir_1$ and $Ir_2$ exceeds the comparison current Icomp. The conduction bits Sc, $Sr_0$, $Sr_1$ and $Sr_2$ are stored into a latch 210c, $210r_0$, $210r_1$ and $210r_2$, respectively. The latched conduction bits Sc,$Sr_0$-$Sr_2$ are then supplied to the logic unit 145.

Figure 2B:
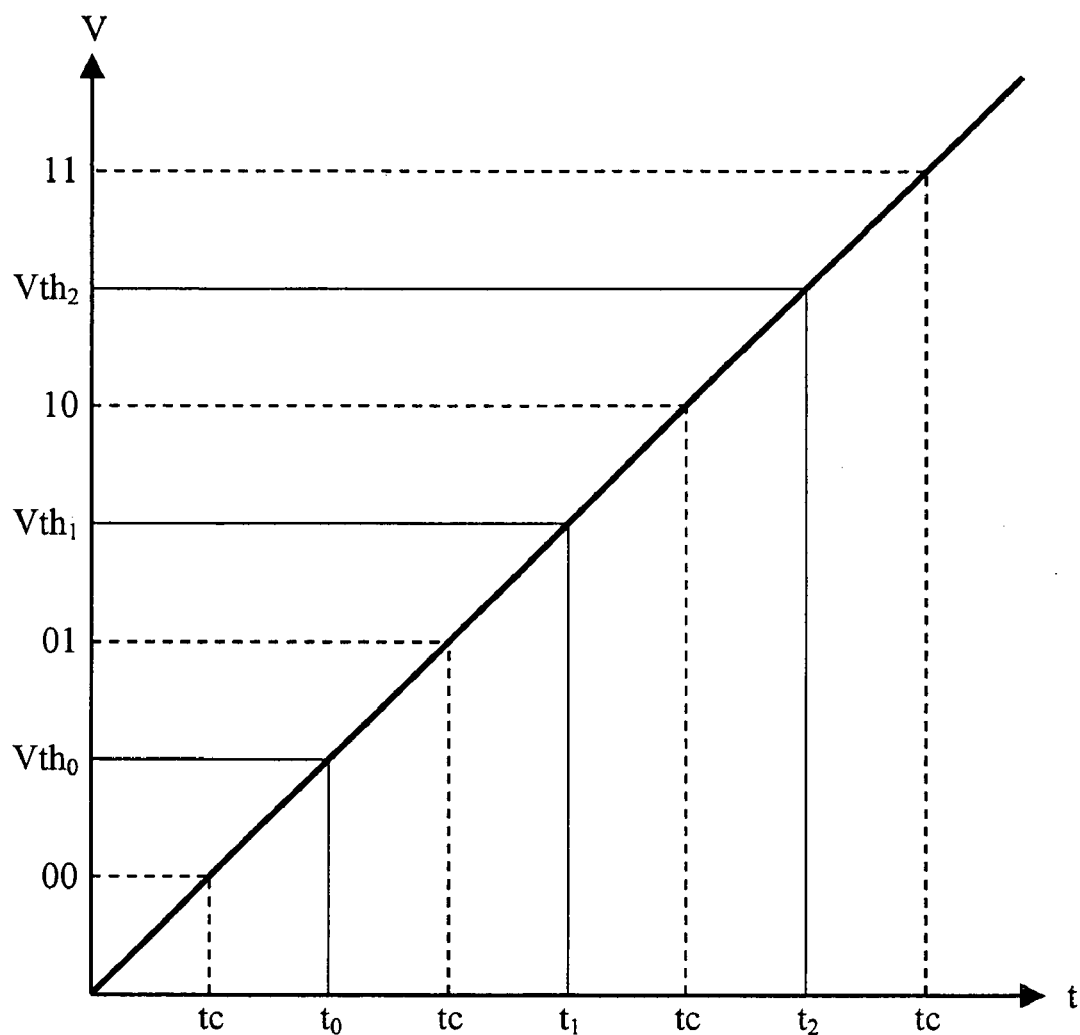
FIG. 2b is an illustrative time diagram explaining operation of the sense amplifier.

As shown in FIG. 2b, the biasing voltage (V) increases over time (t) from the value 0V to a maximum value higher than the threshold voltage $Vthr_2$ (of the last reference cell $Mr_2$). When the biasing voltage reaches the threshold voltage $Vthr_0$ at the time $tr_0$, the reference cell $Mr_0$ turns on; therefore, as soon as the corresponding reference current $Ir_0$ reaches the comparison current Icomp, its conduction bit $Sr_0$ is asserted. The other conduction bits $Sr_1$ and $Sr_2$ are asserted in succession when the biasing voltage reaches the threshold voltage $Vthr_1$ at the time $tr_1$ and the threshold voltage $Vthr_2$ at the time $tr_2$, respectively.

Likewise, the conduction bit Sc is asserted when the biasing voltage reaches the threshold voltage Vthc of the memory cell to be read at the time tc. Therefore, if the time tc precedes the time $tr_0$, the threshold voltage Vthc is lower than the threshold voltage $Vthr_0$ and the memory cell stores the logical value 00. In a similar manner, if the time tc is comprised between the times $tr_0$-$tr_1$ or $tr_1$-$tr_2$ the memory cell stores the logical value 01 or 10, respectively. If the time tc follows the time $tr_2$, or the conduction bit Sc is not asserted when the biasing voltage reaches its maximum value (higher than the threshold voltage $Vthr_2$), the memory cell stores the logical value 11. It should be noted once every conduction bit Sc,$Sr_0$-$Sr_2$ has switched (and the event has been stored into the corresponding latch), the respective (memory or reference) cell can be turned off by means of the row decoder or the associated switch, respectively (so as to reduce the power consumption of the memory device and any noise caused by the current drained from the common ground terminal).

Figure 3A:
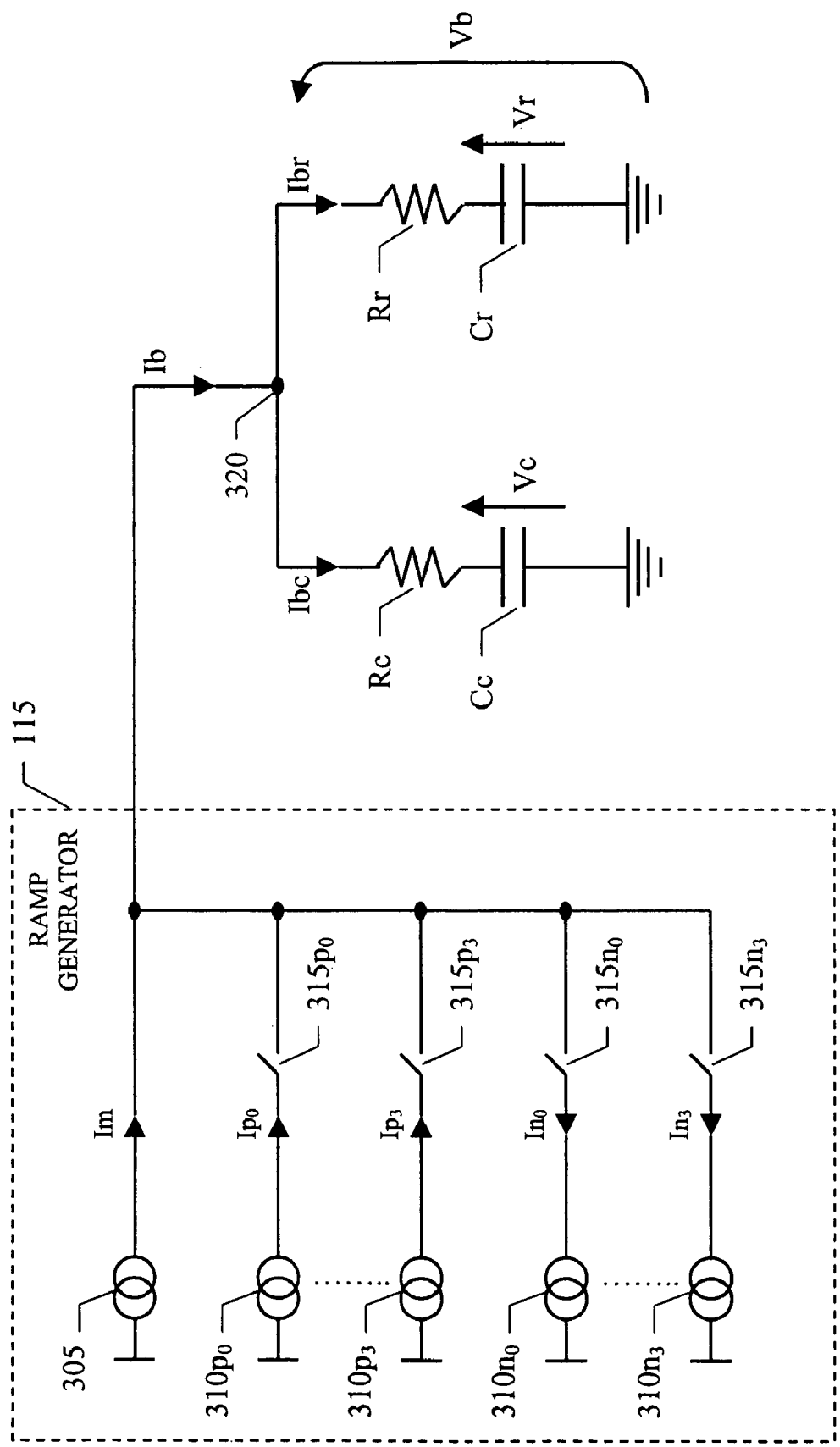
FIG. 3a is a functional representation of a ramp generator according to an embodiment of the invention.

Moving to FIG. 3a, the ramp generator 115 according to an embodiment of the invention includes a main current generator 305 that provides a constant current Im. A plurality of trimming current generators $310p_i$ (with i=0.3 in the example at issue) are connected in parallel to the main generator 305 by means of corresponding switches $315p_i$; each trimming generator $310p_i$ provides a (constant) correction current $Ip_i$, which is added to the main current Im when the respective switch $315p_i$ is closed. Likewise, further trimming current generators $310n_i$ are connected in parallel to the main generator 305 by means of corresponding switches $315n_i$; each trimming generator $310n_i$ provides a (constant) correction current $In_i$, which is subtracted from the main current Im when the respective switch $315n_i$ is closed.

A resulting (constant) biasing current Ib (equal to the main current Im possibly updated by one or more correction currents $Ip_i$,$In_i$) is applied to a common node 320, from which a path including the selected memory cells and a path including the reference cells branch. In order to explain operation of the ramp generator 115, the selected memory cells are represented by an equivalent capacitor Cc connected in series to an equivalent resistor Rc (through which a corresponding biasing current Ibc flows); the capacitor Cc represents the stray capacitance of the selected memory cells, whereas the resistor Rc represents the intrinsic resistance of the row decoder. Likewise, the reference cells are represented by an equivalent capacitor Cr connected in series to an equivalent resistor Rr (through which a corresponding biasing current Ibr flows); the capacitor Cr represents the stray capacitance of the reference cells and the capacitance of the dummy capacitor, whereas the resistor Rr represents the intrinsic resistance of the corresponding driver and the resistance of the dummy resistor. As shown in the figure, the elements Rc,Cc and Rr,Cr are connected in parallel between the common node 320 and the ground terminal.

Figure 3B:
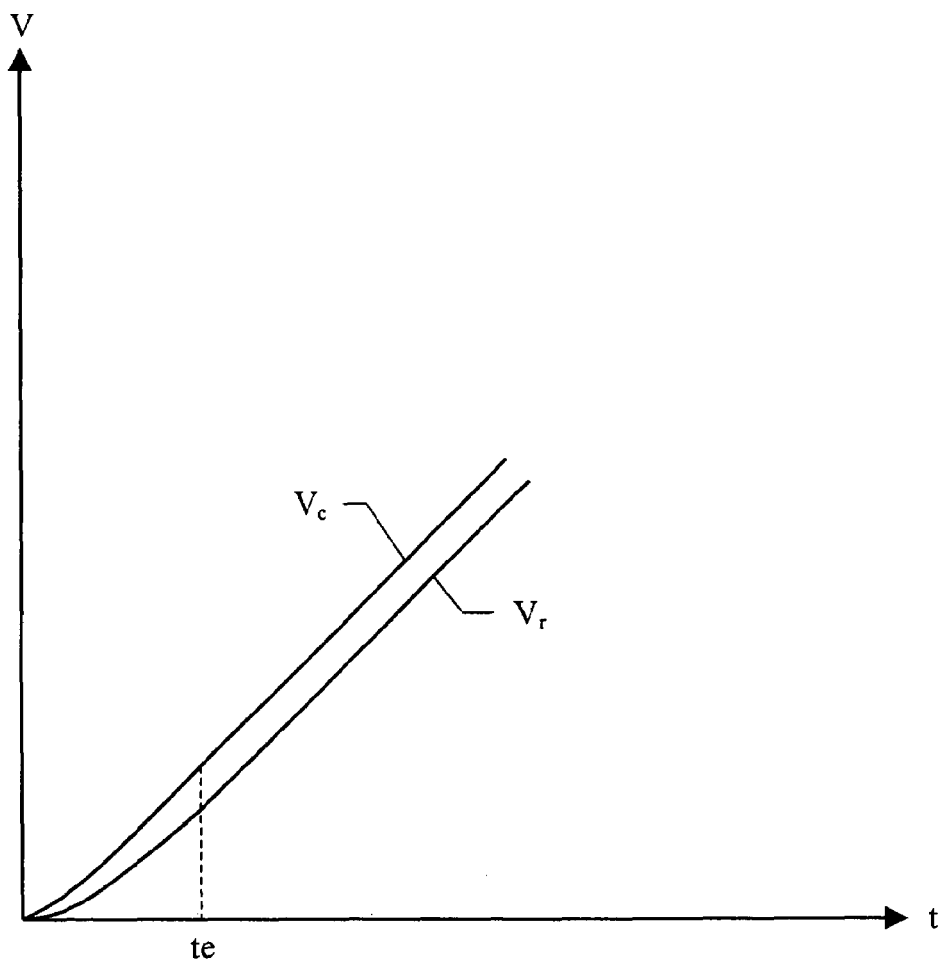
FIG. 3b is an illustrative time diagram explaining operation of the ramp generator.

Considering now FIGS. 3a and 3b together, it is possible to demonstrate that a cell voltage Vc at the capacitor Cc (i.e., at the control gate terminals of the memory cells to be read) and a reference voltage Vr at the capacitor Cr (i.e., at the control gate terminals of the reference cells) change over time with the same constant slope (after a transient period).

Indeed, as soon as the ramp generator 115 is enabled the biasing current Ib starts charging the capacitors Cc and Cr. In this phase, the biasing current Ib splits between the paths Rc,Cc and Rr,Cr according to their time constants. As a result, the corresponding voltages Vc and Vr increase with quadratic laws that are generally different (unless Rc=Rr and Cc=Cr).

An equilibrium condition is reached (at a time te) when the biasing currents Ibc and Ibr become constant. From now on, the voltages Vc and Vr increase linearly according to the following expressions (in the following, the values of the electrical quantities are denoted with the same symbols used to identify the corresponding components in the figures):

$$\frac{Ic}{Cc} = \frac{dVc}{dt} = Sc$$
$$\frac{Ir}{Cr} = \frac{dVr}{dt} = Sr$$

where Sc and Sr are the constant slopes of the cell voltage Vc and of the reference voltage Vr, respectively.

In this condition, the slopes Sc and Sr have the same value. Indeed, we have that:

$$Rc \cdot Ic + Vc = Rr \cdot Ir + Vr$$

and then:

$$Rc \cdot Sc \cdot Cc + Vc = Rr \cdot Sr \cdot Cr + Vr.$$

By deriving both terms with respect to the time, we obtain (being Rc,Sc,Cc and Rr,Sr,Cr constant):

$$\frac{dVc}{dt} = \frac{dVr}{dt}.$$

that is:

$$Sc = Sr.$$

Therefore, denoting with Sb=Sc=Sr the common slope and with Cb=Cc+Cs the total capacitance of the two paths, we have:

$$Ib = Ic + Ir = Sb \cdot Cc + Sb \cdot Cr = Sb \cdot Cb.$$

It should be noted that any mismatch of the elements Rc,Cc and Rr,Cr only causes a temporal translation of the corresponding voltages Vc and Vr (without affecting their slopes). Indeed, denoting with Vb the voltage between the common node 320 and the ground terminal we have:

$$\begin{aligned} Vc &= Vb - Rc \cdot Ic \\ &= Vb - Rc \cdot Sb \cdot Cc \\ &= Vb - \frac{Rc \cdot Ib \cdot Cc}{Cb} \\ &= Vb - \frac{Rc \cdot Cc \cdot Ib}{Cc + Cr} \end{aligned}$$

and likewise:

-continued $$Vr = Vb - \frac{Rr \cdot Cr \cdot Ib}{Cc + Cr}$$

Therefore, the difference between the cell voltage Vc and the reference voltage Vc is:

$$\Delta V = Vc - Vr$$
$$= Vb - \frac{Rc \cdot Cc \cdot Ib}{Cc + Cr} - Vb + \frac{Rr \cdot Cr \cdot Ib}{Cc + Cr}$$
$$= \frac{Ib(Rr \cdot Cr - Rc \cdot Cc)}{Cc + Cr}$$

Typically, the dummy resistor can be set so as to have the resistors Rc and Rr with the same resistance (denoted with Rb); in this case:

$$\Delta V = Ib \cdot Rb \frac{Cr - Cc}{Cc + Cr},$$

that is:

$$\Delta V = Sb \cdot Cb \cdot Rb \frac{Cr - Cc}{Cc + Cr}$$
$$= Sb \cdot (Cc + Cr) \cdot Rb \frac{Cr - Cc}{Cc + Cr}$$
$$= Sb \cdot Rb \cdot (Cr - Cc)$$

Moreover, if the dummy capacitor is set to have Cr=Cc we obtain that <V=0.

In any case, even if the capacitors Cc and Cr (and/or the resistors Rc and Rr) do not match perfectly, the corresponding difference between the voltages Vc and Vr does not adversely affect the correctness of the reading operation. Indeed, the same difference is also present during the programming operation (when the memory cells are read in order to verify their condition); therefore, this difference cancels When the memory cells are subsequently read. The only effect of any mismatch of the elements Rc,Cc and Rr,Cr is a corresponding reduction of a window voltage that is available for storing the desired logical values.

Moreover, it should be noted that the voltages Vc and Vr actually have the desired ramp-like pattern only after the above-described transient period. However, this does not delay the reading operation; indeed, the ramp generator can be used immediately, provided that the transient period ends before the current flowing through the first reference cell reaches the comparison current (causing the assertion of the conduction bit $Sr_0$).

The trimming generators $310p_i,310n_i$ are used to regulate the biasing current Ib so as to obtain the desired slope Sb (of the voltages Vc and Vr). Indeed, as indicated above, the slope Sb depends on the biasing current Ib and on the total capacitance Cb (Sb=Ib/Cb). For example, typical values of the slope Sb are of the order of 50-200∃$10^6$ V/s; therefore, for a total capacitance Cb of the order of 10-50 nF the biasing current Ib would be of the order of 0.5-10 mA. However, the total capacitance Cb can only be estimated with a certain degree of approximation. Nevertheless, the biasing current Ib can be regulated (by enabling one or more of the trimming generators $310p_i,310n_i$ by means of the corresponding switches $315p_i,315n_i$) so as to obtain the desired slope Sb.

Preferably, most of the trimming generators $310p_i,310n_i$ (such as all of them but one, i.e., $310p_{0-2},310n_{0-2}$) provide a correction current $Ip_{0-2},In_{0-2}$ with a very small absolute value (for example, of the order of 0.1-0.6 mA). The trimming generators $310p_{0-2},310n_{0-2}$ are used to perform a fine regulation of the slope Sb that corrects any error in the estimation of the total capacitance Cb (typically very low). On the contrary, the other trimming generators $310p_3,310n_3$ provide a far higher correction current $Ip_3,In_3$ (for example, of the order of 1-5 mA). The trimming generators $310_3,310_3$ are used to perform a rough regulation of the slope Sb that substantially increases and/or decreases the slope Sb (for example, for test purposes).

Naturally, in order to satisfy local and specific requirements, a person skilled in the art may apply to the solution described above many modifications and alterations. Particularly, although the present invention has been described with a certain degree of particularity with reference to preferred embodiment(s) thereof, it should be understood that various omissions, substitutions and changes in the form and details as well as other embodiments are possible; moreover, it is expressly intended that specific elements and/or method steps described in connection with any disclosed embodiment of the invention may be incorporated in any other embodiment as a general matter of design choice.

For example, similar considerations apply if the memory device has a different structure or includes equivalent components. Moreover, the numerical examples described above are merely illustrative and must not be interpreted in a limitative manner.

Likewise, the biasing current can be applied to the selected memory cells and to the reference cells through equivalent paths.

Moreover, it is possible to use other means for equalizing the resistance and/or the capacitance of the two paths.

The solution of the invention is also suitable to be implemented with an equivalent structure for trimming the biasing current, or with other values of the correction currents.

Moreover, the application of the proposed solution to different non-volatile memory devices (for example, E²PROMs, flash memories with NAND architecture, phase-change memories, and the like) is contemplated.

Alternatively, each memory cell can be programmed at a number of levels that is not a power of 2 (with the memory device that includes a corresponding number of reference cells).

Moreover, it will be apparent to those skilled in the art that the additional features providing further advantages are not essential for carrying out the invention, and may be omitted or replaced with different features.

For example, it is possible to use a biasing current that is not constant so as to obtain a biasing voltage having any desired monotone time pattern (either increasing or decreasing over time).

Moreover, the application of different biasing currents to the selected memory cells and to the reference cells independently is not excluded.

In any case, different embodiments without any means for equalizing the resistance and/or the capacitance of the two paths are contemplated.

Alternatively, an implementation that does not allow trimming the biasing current is conceivable.

In addition, it is possible to have correction currents with different values (even all equal).

Even though in the preceding description reference has been made to a non-volatile memory device, this is not to be intended as a limitation (with the proposed solution that can be applied to any other memory device, such as a DRAM).

At the end, the principles of the invention should not be limited to a multi-level memory device (but they also apply to standard memory devices wherein each memory cell stores a single bit and then only one reference cell is provided).

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

The invention claimed is:

1. A memory device, comprising:
   a plurality of memory cells each one for storing a value;
   a reference cell;
   biasing means for biasing a set of selected memory cells of the plurality of memory cells and the reference cell with a biasing voltage having a substantially monotone time pattern;
   means for detecting reaching of a threshold value by respective currents of the selected memory cells and of the reference cell; and
   means for determining the value stored in each selected memory cell according to a temporal relation of the reaching of the threshold value by the currents of the selected memory cell and of the reference cell, wherein:
   the biasing means includes means for applying a controlled biasing current to the selected memory cells and to the reference cell.

2. The memory device according to claim 1, wherein the biasing current is a constant current, the biasing voltage including a ramp-like portion with a constant slope.

3. The memory device according to claim 1, wherein the biasing means includes means for applying the biasing current to a common node from which a first path and a second path branch, the first path including the selected memory cells and the second path including the reference cell.

4. The memory device according to claim 3, further including means for equalizing an equivalent resistance of the first path with an equivalent resistance of the second path.

5. The memory device according to claim 3, further including means for equalizing an equivalent capacitance of the first path with an equivalent capacitance of the second path.

6. The memory device according to claim 1, further including means for trimming the biasing current.

7. The memory device according to claim 6, wherein the means for trimming includes a plurality of trimming elements each one for providing a correction current of the biasing current and means for selectively enabling each trimming element, the correction currents having at least two different absolute values.

8. The memory device according to claim 1, wherein the memory device is non-volatile.

9. The memory device according to claim 8, wherein the memory device is a multi-level memory device.

10. A method for reading a memory device including a plurality of memory cells, each one for storing a value, and a reference cell, the method comprising the steps of:
    biasing a set of selected memory cells of the plurality of memory cells and the reference cell with a biasing voltage having a substantially monotone time pattern;
    detecting the reaching of a threshold value by respective currents of the selected memory cells and of the reference cell; and
    determining the value stored in each selected memory cell according to a temporal relation of the reaching of the threshold value by the currents of the selected memory cell and of the reference cell, wherein:
    the step of biasing includes applying a controlled biasing current to the selected memory cells and to the reference cell.

11. The method of claim 10, wherein the biasing current is a constant current, the biasing voltage including a ramp-like portion with a constant slope.

12. The method of claim 10, wherein the biasing step includes applying the biasing current to a common node from which a first path and a second path branch, the first path including the selected memory cells and the second path including the reference cell.

13. The method of claim 12, further including equalizing an equivalent resistance of the first path with an equivalent resistance of the second path.

14. The method of claim 12, further including equalizing an equivalent capacitance of the first path with an equivalent capacitance of the second path.

15. The method of claim 10, further including trimming the biasing current.

16. The method of claim 15, wherein the trimming step includes selectively enabling one or more of a plurality of trimming elements, each one for providing a correction current of the biasing current, the correction currents having at least two different absolute values.

17. The method of claim 10 wherein the reference cell is one of a plurality of reference cells and the determining step includes determining the value stored in each selected memory cell according to a temporal relation of the reaching of the threshold value by the currents of the selected memory cell and of the plurality of reference cells.

18. A memory device, comprising:
    a plurality of memory cells each one for storing a value;
    a reference cell;
    a read circuit structured to determine a value stored in a selected memory cell of the plurality of memory cells according to a temporal relation at which a threshold value is reached by currents of the selected memory cell and of the reference cell; and
    a biasing circuit structured to apply a controlled biasing current to a common node from which a first path and a second path branch, the first path including the selected memory cell and the second path including the reference cell, the biasing current effecting a biasing voltage having a substantially monotone time pattern.

19. The memory device of claim 18, wherein the biasing current is a constant current.

20. The memory device of claim 18, further comprising a resistance coupled to the reference cell and structured to equalize an equivalent resistance of the first path with an equivalent resistance of the second path.

21. The memory device of claim 18, further comprising a capacitance coupled to the reference cell and structured to equalize an equivalent capacitance of the first path with an equivalent capacitance of the second path.

22. The memory device of claim 18, further comprising:
    a plurality of trimming elements that provide a plurality of correction currents, respectively, the correction currents having at least two different absolute values; and
    a plurality of selection switches that selectively couple the trimming elements, respectively, to the biasing current.

23. The memory device of claim 18, wherein the memory device is non-volatile.

24. The memory device of claim 18, wherein the memory device is a multi-level memory device.

* * * * *